(12) United States Patent
Tang

(10) Patent No.: US 12,276,398 B2
(45) Date of Patent: Apr. 15, 2025

(54) DISTRIBUTED INDUCTION-CONTROLLED SOLAR LIGHTING SYSTEM

(71) Applicant: Shenzhen JinDian Electronic Technology Co., Ltd., Shenzhen (CN)

(72) Inventor: Shifu Tang, Shenzhen (CN)

( * ) Notice: Subject to any disclaimer, the term of this patent is extended or adjusted under 35 U.S.C. 154(b) by 183 days.

(21) Appl. No.: 18/166,417

(22) Filed: Feb. 8, 2023

(65) Prior Publication Data

US 2024/0159368 A1  May 16, 2024

(30) Foreign Application Priority Data

Nov. 11, 2022  (CN) .......................... 202211414945.9

(51) Int. Cl.
| | |
|---|---|
| H03K 17/00 | (2006.01) |
| F21S 9/03 | (2006.01) |
| F21V 23/04 | (2006.01) |
| H03K 17/95 | (2006.01) |
| H05B 47/115 | (2020.01) |
| H05B 47/19 | (2020.01) |

(52) U.S. Cl.
CPC ............ *F21S 9/03* (2013.01); *F21V 23/0471* (2013.01); *H03K 17/9505* (2013.01); *H03K 2017/9507* (2013.01); *H05B 47/115* (2020.01); *H05B 47/19* (2020.01)

(58) Field of Classification Search
CPC ............ F21V 23/0471; H03K 17/9505; H03K 2017/9507; H05B 47/115
See application file for complete search history.

(56) References Cited

U.S. PATENT DOCUMENTS

| | | | |
|---|---|---|---|
| 8,461,778 B2* | 6/2013 | Mohan ................. | H05B 47/115 315/307 |
| 8,884,531 B1* | 11/2014 | Xu ........................ | H05B 47/19 362/183 |
| 10,034,360 B2* | 7/2018 | Shu ....................... | H05B 47/20 |

* cited by examiner

*Primary Examiner* — Tuan T Lam
(74) *Attorney, Agent, or Firm* — Novoclaims Patent Services LLC; Mei Lin Wong

(57) ABSTRACT

A distributed induction-controlled solar lighting system comprises a first light, second lights and an inductive switch. Each light comprises a first sensor and a sub-controller used for controlling the brightness of the light. The inductive switch is spaced apart from the first light and can trigger the brightness of the first light within its preset range to increase when sensing that a pedestrian or an animal passes by. The first sensor can trigger the brightness of the first light and/or the second light within its range to increase when sensing that a pedestrian or an animal passes by. The solar lighting system can sense a signal in advance when a pedestrian or an animal passes by, such that the situation where the lights will not be turned on or brightness will not be increased until a pedestrian or an animal passes by is avoided; each light has a brightness adjustment function and can adjust the brightness of its own according to a sensing signal of the adjacent lights, a special master controller is not needed, unnecessary lighting power is avoided, and the endurance and reliability of the lights are improved.

20 Claims, 2 Drawing Sheets

DISTRIBUTED INDUCTION-CONTROLLED SOLAR LIGHTING SYSTEM

CROSS REFERENCE OF RELATED APPLICATION

This is a non-provisional application which claimed priority of Chinese application number 202211414945.9, filing date Nov. 11, 2022. The contents of these specifications are incorporated herein by reference.

BACKGROUND OF THE PRESENT INVENTION

The invention relates to the technical field of solar lighting control, in particular to a distributed induction-controlled solar lighting system.

DESCRIPTION OF RELATED ARTS

With the development of science, the advance of urbanization and the popularization of social environmental awareness, solar lights are used in life more and more widely. Solar street lights, garden lights and the like can be found everywhere along streets.

Generally, in order to realize continuous lighting within a large range, multiple solar lights are connected to form a lighting system, a master controller is used to sense whether a pedestrian passes by and is connected in series to the solar lights, and the working state, such as on-off and the brightness, of the solar lights is controlled in a centralized manner through a microcontroller unit (MCU) in the master controller. When someone passes by, all lights on a road are controlled by the master controller to be turned on at the same time, which seriously shortens the endurance of the solar lights. Moreover, because the sensing range of the master controller is limited, the lights will not be turned on until pedestrians are extremely close to the master controller, so the use experience needs to be improved.

SUMMARY OF THE PRESENT INVENTION

In view of the defects of the prior art, the objective of the invention is to provide a distributed induction-controlled solar lighting system, which gets rid of the excessively dependence on a master controller, can control adjacent lights to be turned on as needed through an inductive switch and at least part of lights, prolongs the service life of the lights, and improves the endurance and reliability of the lights.

To fulfill the above objective, the invention adopts the following technical solution:

A distributed induction-controlled solar lighting system comprises:

Solar lights comprising a first light and multiple second lights, the multiple second lights being in a communication connection with the first light, and the first light and the second lights each comprising a first sensor used for monitoring pedestrians or animals passing through sensing ranges of the lights in real time and a sub-controller used for controlling brightness of the lights;

An inductive switch spaced apart from the first light and used for triggering the brightness of the first light (la) within its preset range to increase when sensing that a pedestrian or an animal passes by;

The first inductor being able to trigger the brightness of the first light and/or the second lights within its preset range to increase when sensing that a pedestrian or an animal passes by.

In one embodiment, each solar light comprises:
A light source; and
A first solar panel used for converting solar energy into electric energy to supply power to at least one of the light source, the first sensor and the sub-controller of the solar light.

In one embodiment, the first light and the second lights each comprise a wireless receiving and transmitting port, and the first light and the second lights, and the adjacent second lights are connected through the wireless receiving and transmitting ports.

In one embodiment, the wireless receiving and transmitting port and the sub-controller of each solar light are formed on a same circuit board.

On one embodiment, the solar lights comprise one or more first lights.

In one embodiment, the first light and the second lights each comprise a light sensor used for sensing ambient light, and when the ambient light is lower than a preset threshold, the sub-controllers of the first light and the second lights control the corresponding lights to be turned on and keep default first brightness.

In one embodiment, the first light and the second lights each comprise a first change-over switch which is used by users to set default brightness of the lights when the lights do not receive a trigger signal.

In one embodiment, the first light and the second lights each comprise a second change-over switch which is used by users to set a working time of the lights at the increased brightness after the lights receive a trigger signal.

In one embodiment, the inductive switch comprises:
A second sensor used for sensing whether a pedestrian or an animal passes by;
A communication terminal used for sending out the trigger signal when the second sensor senses that a pedestrian or an animal passes by; and
A second solar panel used for converting solar energy into electric energy to supply power to the second sensor of the corresponding solar light.

In one embodiment, the communication terminal is a wireless communication terminal, and the second solar panel also supplies power to the communication terminal of the corresponding solar light;

The inductive switch further comprises:
A reset key which is in a communication connection with the communication terminal and used for initializing the communication terminal after being operated, to enable the communication terminal to match and be connected to the first light within the preset range of the inductive switch again.

According to the invention, the inductive switch and at least part of the solar lights can sense a signal in advance for adjacent solar lights when a pedestrian or an animal passes by, such that the situation where the lights will not be turned on or brightness will not be increased until a pedestrian or an animal passes by is avoided; each solar light has a brightness adjustment function and can adjust the brightness of its own according to a sensing signal of the adjacent lights, the lights can be turned on when a pedestrian approaches and can be turned off or become dark when the pedestrian leaves, a special master controller is not needed, unnecessary lighting power is avoided, and the endurance and reliability of the lights are improved.

| Reference signs: | | | | | | | |
|---|---|---|---|---|---|---|---|
| 1 | First solar panel | 2 | Second solar panel | 10 | Solar light | 10a | First light |
| 10b | Second light | 11 | Light source | 12 | First sensor | 13 | Sub-controller |
| 20 | Inductive switch | 21 | Second sensor | 22 | Communication terminal | 23 | Reset key |

DETAILED DESCRIPTION OF THE PREFERRED EMBODIMENT

In the invention, the terms "dispose", "provided with" and "connect" should be broadly understood. For example, "connect" may refer to fixed connection, detachable connection, or integral connection; or, mechanical connection or electrical connection; or, direct connection, indirect connection through an intermediate medium, or internal communication of two devices, elements or constituent parts. Those ordinarily skilled in the art can understand the specific meanings of these terms in the invention as the case may be.

Terms such as "upper", "lower", "front", "back", "left", "right", "vertical", "horizontal". "top", "bottom", "inner" and "outer" are used to indicate directional or positional relations based on the accompanying drawings merely for the purpose of facilitating and simplifying the description of the application, and do not indicate or imply that devices or elements referred to must be in a specific direction, or be configured and operated in a specific direction, so they should not be construed as limitations of the application.

In addition, terms "first" and "second" are merely for a purpose of description, and should not be construed as indicating or implying relative importance or implicitly indicating the number of technical features referred to. Thus, a feature defined by "first" or "second" may explicitly or implicitly refer to the inclusion of at least one said feature. In the description of the application, "multiple" refer to at least two such as two or three, unless otherwise specifically defined.

Moreover, in addition to indicating directional or positional relations, the above terms may have other meanings. For example, "upper" may be used to denote a certain relation of attachment or connection. Those ordinarily skilled in the art can understand the specific meanings of these terms in the invention as the case may be.

For the sake of a better understanding of the purposes, technical solutions and advantages of the invention, the invention will be described in further detail below in conjunction with accompanying drawings and embodiments. It should be understood that the specific embodiments described here are merely used to explain the invention, and are not used to limit the invention.

Figure 1:
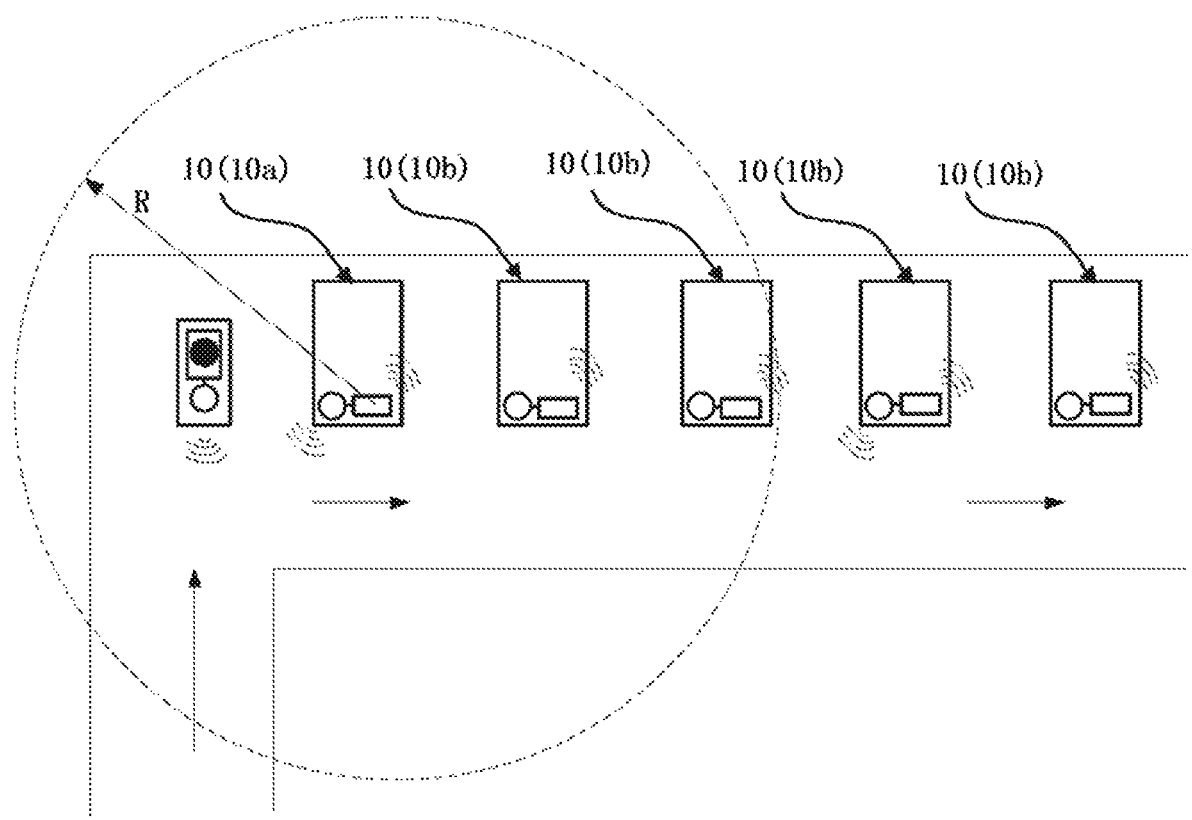
FIG. 1 is a structural diagram of a solar lighting system according to one embodiment of the invention.

Referring to FIG. 1, one embodiment of the invention provides a distributed induction-controlled solar lighting system, comprising solar lights 10 and an inductive switch 20 in a communication connection with the solar lights 10, wherein the solar lights 10 and the inductive switch 20 have the function of sensing whether a pedestrian or an animal passes by, the inductive switch 20 may be disposed at a starting point of a road, the solar lights 10 may be connected to downstream of the inductive switch 20 linearly or in an array, and a sub-controller 13 is disposed in each solar light 10 to independently adjust the brightness of the solar light.

As shown in FIG. 1, when lighting is needed in a dark environment, a pedestrian enters the road from a crossroad on the left, turns right, and then walks from left to right. When the pedestrian enters the road from the crossroad on the left, because the sensing range of the leftmost solar light 10 of an existing lighting system is limited, the pedestrian has to walk across the crossroad on the left without lighting, then turns rights to enter the sensing range of the first solar light 10 on the left (namely a first light 10a), at this moment, all the lights are turned on, and then, the pedestrian walks to the end of the road from left to right. Compared with the existing lighting system, the inductive switch 20 on the left of the distributed induction-controlled solar lighting system provided by the invention is closer to the crossroad on the left than the first solar light 10 on the left, so the pedestrian will be sensed exactly when the pedestrian enters the crossroad on the left, solar lights 10 (such as the first light 10a and one or more second lights 10b adjacent to the first light 10a) within the signal coverage R of the inductive switch 20 will be turned on in advance, and solar lights 10 out of the signal coverage R of the inductive switch 20 are kept in the initial working state (such as a low-brightness mode or an off mode); when the pedestrian walks forward from the first solar light 10 on the left after turning right, the solar light 10 on the left senses the pedestrian and triggers the solar lights 10 on the right to be turned on in advance or increase the brightness of the solar lights 10, and solar lights 10 (on the left in FIG. 1) behind the pedestrian gradually return to the initial working state (for example through a delay circuit), such that electricity is saved, and the endurance of the solar lights is improved.

In this embodiment, the solar lights 10 comprise a first light 10a and multiple second lights 10b, wherein the multiple second lights 10b are in a communication connection with the first light 10a, and the first light 10a and the second lights 10b each comprise a first sensor 12 used for monitoring pedestrians or animals within their sensing ranges in real time and a sub-controller 13 used for controlling the brightness of the lights; and the inductive switch 20 is used for transmitting a first trigger signal to the first light 10a when sensing that a pedestrian or an animal passes by.

In the embodiment shown in FIG. 1, one first light 10a and multiple second lights 10b sequentially connected in series to the downstream of the first light 10a are disposed. It can be understood that more first lights 10a can be disposed and one second light 10b or a string of second lights 10b may be connected to the downstream of each first light 10a and each second light 10b. The application has no limitation in this aspect. When a pedestrian passes by, all solar lights 10 within an area using the solar light 10 closest to the pedestrian as the center and a preset range (such as the signal coverage R) as a radium will be kept in a high-brightness working mode.

Wherein, the inductive switch 20 is spaced apart from the first light 10a, and when receiving the first trigger signal, the sub-controller 13 of the first light 10a controls the brightness of the first light 10a to increase. Here, the brightness increases in the following way: for example, if the initial state of the light is an off mode, the "brightness increase"

refers to turning on the light; if the initial state of the light is a low-brightness mode, the "brightness increase" refers to increasing the brightness of the light. Similarly, when the first sensor 12 of the first light 10a senses that a pedestrian or an animal passes by, the sub-controllers 13 of the second lights 10b transmit a second trigger signal to the sub-controllers 13 of the first light 10a and/or the second lights 10b within their preset range R to control the brightness of the corresponding lights to increase.

It can be understood that, in this embodiment, the communication range of the inductive switch 20 and the communication range of the first light 10a and the second lights 10b are identical (both R). In other embodiments, the communication range of the inductive switch 20 may be different from the communication range of the first light 10a and the second lights 10b.

Figure 2:
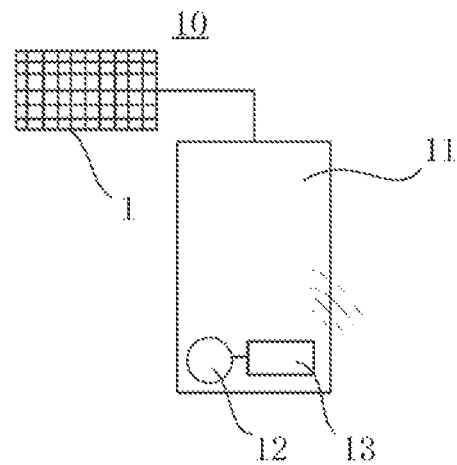
FIG. 2 is a structural diagram of a solar light according to one embodiment of the invention.

As shown in FIG. 2, in one embodiment, each solar light 10 may comprise a light source 11, a first sensor 12, a sub-controller 13 and a first solar panel 1, wherein the first solar panel 1 may be used for converting solar energy into electric energy to supply power to at least one of the light source 11, the first sensor 12 and the sub-controller 13 of the solar light 10. The first solar panel 1 is used to supply power to the first sensor 12, so each solar light 10 can keep working in 24 hours. Because wireless communication is adopted between the solar lights 10, as well as between the solar lights 10 and the inductive switch 20, it is unnecessary to arrange wires between the inductive switch 20 and the solar lights 10 or to connect the inductive switch 20 and the solar lights 10 to an external power supply, and uninterruptible power supply and control can be realized as long as the positions of the structures are reasonably set, which is extremely easy.

For example, the first light 10a and the second lights 10b each comprise a wireless receiving and transmitting port, the first light 10a and the second lights 10b are connected through the wireless receiving and transmitting ports, and the adjacent second lights 10b are connected also through the wireless receiving and transmitting ports. The wireless receiving and transmitting port and the sub-controller 13 of each solar light 10 may be formed on a same circuit board.

In other embodiments, the first light 10a and the second lights 10b may be connected through optical fibers, and the adjacent second lights 10b may be connected through optical fibers.

In addition, to easily control the working state of the solar lights 10, the first light 10a and the second lights 10b each comprise a light sensor for sensing ambient light. When the ambient light is lower than a preset threshold, the sub-controllers 13 of the first light 10a and the second lights 10b control the corresponding lights to be turned on and keep default first brightness. When the ambient light reaches the preset threshold, the sub-controllers 13 of the first light 10a and the second lights 10b control the corresponding lights not to be turned on. Storage batteries may be disposed in each first light 10a, each second light 10b and the inductive switch 20, and in presence of light, the storage batteries can be charged by the corresponding solar panels.

Illustratively, the first light 10a and the second lights 10b have an off mode, a first working mode and a second working mode. The brightness of the first light 10a and the second lights 10b in the first working mode is lower than the brightness of the first light 10a and the second lights 10b in the second working mode. The first light 10a and the second lights 10b are not turned on in the off mode. The first working mode is a default low-power working mode, and the second working mode is a high-brightness lighting mode in which the brightness of the lights is lower than the brightness of the lights in the low-power working mode. When nobody passes by, the lights may be kept in the off mode or the low-power working mode. When someone passes by, the lights may be kept in the high-brightness lighting mode.

Figure 3:
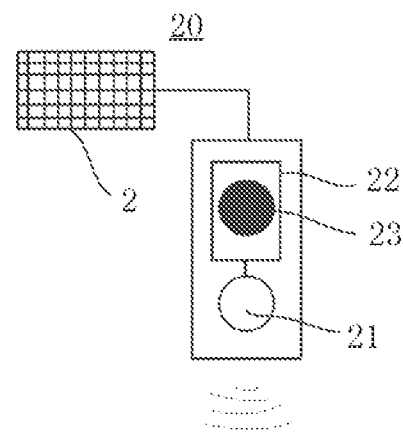
FIG. 3 is a structural diagram of an inductive switch according to one embodiment of the invention.

As shown in FIG. 3, the inductive switch 20 may comprise a second sensor 21, a communication terminal 22 and a second solar panel 2, wherein the second sensor 21 may be used for sensing whether a pedestrian or an animal passes by, the communication terminal 22 may be used for sending out a first trigger signal when the second sensor 21 senses that a pedestrian or an animal passes by, and the second solar panel 2 may convert solar energy into electric energy to supply power to the second sensor 21 and/or the communication terminal 22 of the corresponding solar light 10. The second sensor 21 and the communication terminal 22 may form on a same circuit board.

The communication terminal 22 is a wireless communication terminal. The second solar panel 2 also supplies power to the communication terminal 22 of the corresponding solar light 10. The inductive switch 20 further comprises a reset key 23, which is connected to the communication terminal 22 and is used for initializing the communication terminal 22 after being operated, to enable the communication terminal 22 to match and be connected to the first light 10a within the preset range again. For example, every time a local network is reestablished for communication to network the induction switch 20 and the solar lights 10 in the local network, the reset key 23 needs to be manually operated to enable the communication terminal 22 to match and be connected to the receiving and transmitting ports of the solar lights, such that inductive switch 20 and the solar lights 10 are located in the same local network.

It can be understood that the wireless communication between the inductive switch 20 and the solar lights 10, as well as between the solar lights 10 may be realized through various existing wireless communication methods such as ZigBee, Bluetooth, wireless carrier communication, and WIFI.

In one embodiment, the first light 10a and the second lights 10b each comprise a first change-over switch which is used by users to set default brightness of the lights when the lights do not receive a trigger signal. For example, when the first change-over switches are operated for the first time, the default brightness of the lights may be set to low brightness; when the first change-over switches are operated again, the default brightness of the lights is set to normal brightness; when the first change-over switches are operated again, the default brightness of the lights is set to the low brightness again.

In another embodiment, the first light 10a and the second lights 10b each comprise a second change-over switch which is used by users to set the working time of the lights at increased brightness after the lights receive a trigger signal. That is, the second change-over switches may be used for setting the time of the lights at the increased brightness after the lights receive the trigger signal. Illustratively, multiple time levels can be set for the lights, and the lights can be switched between the multiple time levels by cyclically operating the second change-over switches, so as to set the working time of the lights after pedestrians leave the sensing range of the inductive switch 20 and the solar lights 10.

To sum up, the solar lighting system provided by the embodiments of the application eliminates centralized control of traditional lighting systems excessively depending on a master controller, can avoid the situation where the service life of lights is shortened due to a heavy workload of the master controller and the situation where the whole solar light system cannot work normally in case of a fault of the master controller, and improves the overall reliability of the lighting system. In addition, the inductive switch and at least part of the solar lights can sense a signal in advance for adjacent solar lights when a pedestrian or an animal passes by, such that the situation where the lights will not be turned on or brightness will not be increased until a pedestrian or an animal passes by is avoided; each solar light has a brightness adjustment function and can adjust the brightness of its own according to a sensing signal of the adjacent lights, the lights can be turned on when a pedestrian approaches and can be turned off or become dark when the pedestrian leaves, a special master controller is not needed, unnecessary lighting power is avoided, and the endurance of the lights is improved.

The above description is merely used for explain specific embodiments of the application. It should be pointed out that those ordinarily skilled in the art can make some improvements and embellishments without departing from the principle of the application, and all these improvements and embellishments should fall within the protection scope of the invention.

What is claimed is:

1. A distributed induction-controlled solar lighting system, comprising:
   solar lights (10) comprising a first light (10a) and multiple second lights (10b), the multiple second lights (10b) being in a communication connection with the first light (10a), and the first light (10a) and the second lights (10b) each comprising a first sensor (12) used for monitoring pedestrians or animals passing through sensing ranges of the lights in real time and a sub-controller (13) used for controlling brightness of the lights;
   an inductive switch (20) spaced apart from the first light (10a) and used for triggering the brightness of the first light (10a) within its preset range to increase when sensing that a pedestrian or an animal passes by;
   the first sensor (12) being able to trigger the brightness of the first light (10a) and/or the second lights (10b) within its preset range to increase when sensing that a pedestrian or an animal passes by.

2. The distributed induction-controlled solar lighting system according to claim 1, wherein each said solar light (10) comprises:
   a light source (11); and
   a first solar panel (1) used for converting solar energy into electric energy to supply power to at least one of the light source (11), the first sensor (12) and the sub-controller (13) of the solar light (10).

3. The distributed induction-controlled solar lighting system according to claim 1, wherein the first light 10 (a) and the second lights (10b) each comprise a wireless receiving and transmitting port, and the first light (10a) and the second lights (10b), and the adjacent second lights (10b) are connected through the wireless receiving and transmitting ports.

4. The distributed induction-controlled solar lighting system according to claim 3, wherein the wireless receiving and transmitting port and the sub-controller (13) of each said solar light (10) are formed on a same circuit board.

5. The distributed induction-controlled solar lighting system according to claim 1, wherein the solar lights (10) comprise one or more first lights (10a).

6. The distributed induction-controlled solar lighting system according to claim 1, wherein the first light (10a) and the second lights (10b) each comprise a light sensor used for sensing ambient light, and when the ambient light is lower than a preset threshold, the sub-controllers (13) of the first light (10a) and the second lights (10b) control the corresponding lights to be turned on and keep default first brightness.

7. The distributed induction-controlled solar lighting system according to claim 1, wherein the first light (10a) and the second lights (10b) each comprise a first change-over switch which is used by users to set default brightness of the lights when the lights do not receive a trigger signal.

8. The distributed induction-controlled solar lighting system according to claim 1, wherein the first light (10a) and the second lights (10b) each comprise a second change-over switch which is used by users to set a working time of the lights at the increased brightness after the lights receive a trigger signal.

9. The distributed induction-controlled solar lighting system according to claim 1, wherein the inductive switch (20) comprises:
   a second sensor (21) used for sensing whether a pedestrian or an animal passes by;
   a communication terminal (22) used for sending out the trigger signal when the second sensor (21) senses that a pedestrian or an animal passes by; and
   a second solar panel (2) used for converting solar energy into electric energy to supply power to the second sensor (21) of the corresponding solar light (10).

10. The distributed induction-controlled solar lighting system according to claim 9, wherein the communication terminal (22) is a wireless communication terminal, and the second solar panel (2) also supplies power to the communication terminal (22) of the corresponding solar light (10);
    the inductive switch (20) further comprises:
    a reset key (23) which is in a communication connection with the communication terminal (22) and used for initializing the communication terminal (22) after being operated, to enable the communication terminal (22) to match and be connected to the first light (10a) within the preset range of the inductive switch (20) again.

11. The distributed induction-controlled solar lighting system according to claim 2, wherein the inductive switch (20) comprises:
    a second sensor (21) used for sensing whether a pedestrian or an animal passes by;
    a communication terminal (22) used for sending out the trigger signal when the second sensor (21) senses that a pedestrian or an animal passes by; and
    a second solar panel (2) used for converting solar energy into electric energy to supply power to the second sensor (21) of the corresponding solar light (10).

12. The distributed induction-controlled solar lighting system according to claim 11, wherein the communication terminal (22) is a wireless communication terminal, and the second solar panel (2) also supplies power to the communication terminal (22) of the corresponding solar light (10);
    the inductive switch (20) further comprises:
    a reset key (23) which is in a communication connection with the communication terminal (22) and used for initializing the communication terminal (22) after being operated, to enable the communication terminal (22) to match and be connected to the first light (10a) within the preset range of the inductive switch (20) again.

13. The distributed induction-controlled solar lighting system according to claim 3, wherein the inductive switch (20) comprises:
- a second sensor (21) used for sensing whether a pedestrian or an animal passes by;
- a communication terminal (22) used for sending out the trigger signal when the second sensor (21) senses that a pedestrian or an animal passes by; and
- a second solar panel (2) used for converting solar energy into electric energy to supply power to the second sensor (21) of the corresponding solar light (10).

14. The distributed induction-controlled solar lighting system according to claim 13, wherein the communication terminal (22) is a wireless communication terminal, and the second solar panel (2) also supplies power to the communication terminal (22) of the corresponding solar light (10); the inductive switch (20) further comprises:
- a reset key (23) which is in a communication connection with the communication terminal (22) and used for initializing the communication terminal (22) after being operated, to enable the communication terminal (22) to match and be connected to the first light (10a) within the preset range of the inductive switch (20) again.

15. The distributed induction-controlled solar lighting system according to claim 4, wherein the inductive switch (20) comprises:
- a second sensor (21) used for sensing whether a pedestrian or an animal passes by;
- a communication terminal (22) used for sending out the trigger signal when the second sensor (21) senses that a pedestrian or an animal passes by; and
- a second solar panel (2) used for converting solar energy into electric energy to supply power to the second sensor (21) of the corresponding solar light (10).

16. The distributed induction-controlled solar lighting system according to claim 15, wherein the communication terminal (22) is a wireless communication terminal, and the second solar panel (2) also supplies power to the communication terminal (22) of the corresponding solar light (10); the inductive switch (20) further comprises:
- a reset key (23) which is in a communication connection with the communication terminal (22) and used for initializing the communication terminal (22) after being operated, to enable the communication terminal (22) to match and be connected to the first light (10a) within the preset range of the inductive switch (20) again.

17. The distributed induction-controlled solar lighting system according to claim 6, wherein the inductive switch (20) comprises:
- a second sensor (21) used for sensing whether a pedestrian or an animal passes by;
- a communication terminal (22) used for sending out the trigger signal when the second sensor (21) senses that a pedestrian or an animal passes by; and
- a second solar panel (2) used for converting solar energy into electric energy to supply power to the second sensor (21) of the corresponding solar light (10).

18. The distributed induction-controlled solar lighting system according to claim 17, wherein the communication terminal (22) is a wireless communication terminal, and the second solar panel (2) also supplies power to the communication terminal (22) of the corresponding solar light (10); the inductive switch (20) further comprises:
- a reset key (23) which is in a communication connection with the communication terminal (22) and used for initializing the communication terminal (22) after being operated, to enable the communication terminal (22) to match and be connected to the first light (10a) within the preset range of the inductive switch (20) again.

19. The distributed induction-controlled solar lighting system according to claim 8, wherein the inductive switch (20) comprises:
- a second sensor (21) used for sensing whether a pedestrian or an animal passes by;
- a communication terminal (22) used for sending out the trigger signal when the second sensor (21) senses that a pedestrian or an animal passes by; and
- a second solar panel (2) used for converting solar energy into electric energy to supply power to the second sensor (21) of the corresponding solar light (10).

20. The distributed induction-controlled solar lighting system according to claim 19, wherein the communication terminal (22) is a wireless communication terminal, and the second solar panel (2) also supplies power to the communication terminal (22) of the corresponding solar light (10); the inductive switch (20) further comprises:
- a reset key (23) which is in a communication connection with the communication terminal (22) and used for initializing the communication terminal (22) after being operated, to enable the communication terminal (22) to match and be connected to the first light (10a) within the preset range of the inductive switch (20) again.

* * * * *